US009856140B2

(12) United States Patent
Huygens et al.

(10) Patent No.: US 9,856,140 B2
(45) Date of Patent: Jan. 2, 2018

(54) SUBSTRATE PLATE FOR MEMS DEVICES

(71) Applicant: OCE-TECHNOLOGIES B.V., Venlo (NL)

(72) Inventors: Maikel A. J. Huygens, Heeze (NL); René J. Van Der Meer, Venlo (NL); Reinier Pannekoek, Helden (NL); Alex N. Westland, Baarlo (NL)

(73) Assignee: OCE-TECHNOLOGIES B.V., Venlo (NL)

( * ) Notice: Subject to any disclaimer, the term of this patent is extended or adjusted under 35 U.S.C. 154(b) by 142 days.

(21) Appl. No.: 14/512,105

(22) Filed: Oct. 10, 2014

(65) Prior Publication Data

US 2015/0102835 A1 Apr. 16, 2015

(30) Foreign Application Priority Data

Oct. 11, 2013 (EP) ...................................... 13188352

(51) Int. Cl.
*G01R 31/02* (2006.01)
*B81C 99/00* (2010.01)
(Continued)

(52) U.S. Cl.
CPC ......... *B81C 99/004* (2013.01); *B41J 2/14233* (2013.01); *B41J 2/161* (2013.01); *B41J 2/1632* (2013.01); *B81B 7/007* (2013.01); *B81C 1/00301* (2013.01); *G01R 31/02* (2013.01); *G01R 31/2601* (2013.01); *H05K 1/111* (2013.01); *B41J 2002/14241* (2013.01); *B41J 2002/14491* (2013.01); *B81B 2201/052* (2013.01); *B81B 2207/03* (2013.01); *H05K 1/0268* (2013.01); *H05K 2201/09372* (2013.01)

(58) Field of Classification Search
CPC ...................... G01R 31/31924; G01R 31/3004
USPC ........................ 324/762.02; 174/261; 438/51
See application file for complete search history.

(56) References Cited

U.S. PATENT DOCUMENTS 6,624,003 B1 * 9/2003 Rice ........................ B81B 7/007
438/106
8,633,552 B1 * 1/2014 Wissman ............. H03H 3/0072
257/414
9,040,360 B1 * 5/2015 Minervini ............ H04R 19/016
257/704

(Continued)

FOREIGN PATENT DOCUMENTS

EP 2290686 A2 3/2011

*Primary Examiner* — Tung X Nguyen
*Assistant Examiner* — Dominic Hawkins
(74) *Attorney, Agent, or Firm* — Birch, Stewart, Kolasch & Birch, LLP

(57) ABSTRACT

A substrate plate is provided for at least one MEMS device to be mounted thereon. The MEMS device has a certain footprint on the substrate plate, and the substrate plate has a pattern of electrically conductive leads to be connected to electric components of the MEMS device. The pattern forms contact pads within the footprint of the MEMS device and includes at least one lead structure that extends on the substrate plate outside of the footprint of the MEMS device and connects a number of the contact pads to an extra contact pad. The lead structure is a shunt bar that interconnects a plurality of contact pads of the MEMS device and is arranged to be removed by means of a dicing cut separating the substrate plate into a plurality of chip-sized units. At least a major part of the extra contact pad is formed within the footprint of one of the MEMS devices.

7 Claims, 5 Drawing Sheets

(51) Int. Cl.
*B81B 7/00* (2006.01)
*B81C 1/00* (2006.01)
*G01R 31/26* (2014.01)
*H05K 1/11* (2006.01)
*B41J 2/14* (2006.01)
*B41J 2/16* (2006.01)
*H05K 1/02* (2006.01)

(56) References Cited

U.S. PATENT DOCUMENTS

| | | | |
|---|---|---|---|
| 2001/0033183 A1 | 10/2001 | Fenner et al. | |
| 2003/0211654 A1 | 11/2003 | Kocian et al. | |
| 2007/0143048 A1 | 6/2007 | Yamaguchi et al. | |
| 2009/0039489 A1* | 2/2009 | Ting | B81C 3/002 257/680 |
| 2009/0160466 A1* | 6/2009 | Liu | G01R 31/2884 324/762.02 |
| 2009/0243645 A1* | 10/2009 | Shinkawata | G01R 31/2884 324/750.16 |
| 2009/0261476 A1* | 10/2009 | Huang | H01L 21/6835 257/766 |
| 2012/0080764 A1* | 4/2012 | Xue | B81B 7/0074 257/417 |
| 2012/0267730 A1* | 10/2012 | Renard | B81B 7/0064 257/415 |
| 2013/0082258 A1 | 4/2013 | Azzopardi et al. | |
| 2014/0210019 A1* | 7/2014 | Nasiri | B81C 1/0023 257/415 |
| 2014/0239423 A1* | 8/2014 | Liu | B81C 1/00793 257/417 |

\* cited by examiner

SUBSTRATE PLATE FOR MEMS DEVICES

CROSS-REFERENCE TO RELATED APPLICATIONS

This application claims priority under 35 U.S.C. §119(a) to Application No. 13188352.2, filed in Europe on Oct. 11, 2013, the entirety of which is expressly incorporated herein by reference.

BACKGROUND OF THE INVENTION

1. Field of the Invention

The present invention relates to a substrate plate for at least one MEMS device to be mounted thereon. The MEMS device has a certain footprint on the substrate plate, and the substrate plate has a pattern of electrically conductive leads to be connected to electric components of the MEMS device. The pattern forms contact pads within the footprint of the MEMS device and comprises at least one lead structure that extends on the substrate plate outside of the footprint of the MEMS device and connects a number of said contact pads to an extra contact pad. The lead structure is a shunt bar that interconnects a plurality of contact pads of the MEMS device and is arranged to be removed by means of a dicing cut separating the substrate plate into a plurality of chip-size units.

2. Background of the Invention

An example of a MEMS device (i.e. a micro-electro-mechanical system device) to which the invention is applicable is an array of nozzle and actuator units of an ink jet print head. In this case, the MEMS device comprises a plurality of nozzles, each of which is connected to an ink duct and is associated with a piezoelectric actuator which, when energized, creates a pressure wave in the ink contained in the ink duct, so that an ink droplet is expelled from the nozzle. Each of the piezoelectric actuators has at least two electrodes, i.e. a ground electrode and a signal electrode to which a voltage is to be applied in order to energize the actuator. While a common ground lead may be provided on the substrate plate and be connected to the respective ground electrodes of all actuators in the MEMS device, the signal electrodes of the actuators are electrically isolated from one another so that the actuators may be energized individually and independently. Consequently, the pattern of electrically conductive leads includes at least one lead for each signal electrode, and each of these leads is connected to a contact pad, e. g. a wire bonding pad, permitting contact between the signal electrode of the corresponding actuator.

In a typical process of manufacturing MEMS chips, the substrate plate will initially take the form of a wafer on which conductive patterns for a plurality of chips are formed. Then, a plurality of MEMS devices will be formed step by step on this wafer, and finally the wafer is diced, i.e. cut into a plurality of chip-sized units (MEMS chips), which will then be packaged in suitable casings. The casing has a plurality of contact terminals, each of which is connected to one of the contact pads, e.g. by wire bonding.

Substrate plates of the type indicated above have been disclosed in U.S. Application Publication No. 2013/0082258 A1 and EP 2 290 686 A2.

A disadvantage of the substrate plate disclosed in U.S. Application Publication No. 2013/0082258 A1 is that prior to commonly testing the MEMS devices mounted thereon, partial separation of individual MEMS devices is required by providing separation trenches.

A disadvantage of the substrate plate disclosed in EP 2 290 686 A2 is that because of the location of the extra (dummy) pad, which is in the scribe line, the area of the extra contact pad that is available for contacting the MEMS devices during a test is limited to the narrow scribe line that is cut away in the dicing step. Due to the limited area of this extra contact pad, the electrical resistance may become too high in a test process and/or in a manufacturing process in which the extra contact pad is used for, e.g. polarizing a piezoelectric material.

SUMMARY OF THE INVENTION

It is an object of the present invention to facilitate the process of manufacturing and/or testing MEMS chips.

According to an embodiment of the present invention, at least a major part of said extra contact pad is formed within the footprint of the MEMS device.

Since the lead structure extends outside of the footprint of the MEMS device, it will be cut away when the substrate plate is diced, thereby interrupting the electrical connection between the extra contact pad and the associated contact pad in the footprint of the MEMS device.

According to an embodiment, the present invention offers the advantage that it provides an extra contact pad with a sufficient size for reliable contact during the test and manufacturing procedures, which extra contact pad does not increase the necessary total area of the substrate plate, because the major part of said extra contact pad is included in the footprint of one of the MEMS devices. As described above, the extra contact pad will nevertheless be automatically disconnected from the regular contact pads of the MEMS devices in the dicing step.

The extra contact pad may be used for applying a voltage to certain electric components of the MEMS device during the manufacturing process and/or for applying test signals (e.g. for burn-in tests and leakage tests) to the MEMS device or for measuring electric potentials or currents of the electric components in a test process.

Using the extra contact pad instead of the regular contact pads within the footprint of the MEMS device has the advantage that the regular contact pads need not be used in the manufacturing and/or test process, which avoids a risk of these contact pads being damaged before the permanent bonds are established in the packaging process.

According to an embodiment, the present invention further offers the advantageous possibility to use the extra contact pad for short-circuiting a plurality of components of the MEMS device, or even of a plurality of MEMS devices formed on the same wafer, in order to apply a common process or test signal to these components and/or to measure an output voltage or current of these components with high efficiency, because only a single electrical contact has to be established for this purpose. When a plurality of MEMS devices formed on the same wafer is short-circuited, a lead structure may connect the extra contact pad with a plurality of contact pads of a plurality of components of different MEMS devices. At least a major part of the extra contact pad may be located within the footprint of one of said MEMS devices.

Therefore, in an embodiment, the present invention pertains to a substrate plate carrying at least two MEMS devices and corresponding patterns, which have said lead structure in common, wherein at least a major part of said extra contact pad is formed within the footprint of one of the MEMS devices.

For example, in a typical process of manufacturing a piezoelectric print head, it is necessary in the production process to polarize the piezoelectric material of the actuators. To this end, a voltage of suitable height is applied between the signal electrodes and ground electrodes of each actuator, while a predetermined condition of the piezoelectric material is established, e.g. a predetermined temperature condition, so that the polarization imposed by the applied voltage is "frozen" in the piezoelectric material. Since the same voltage has to be applied to all actuators in the MEMS device or even on the whole wafer, it is very convenient to use the contact pattern outside of the footprint of any device for this purpose. Since the lead structure connecting this extra contact pad to the individual actuators is cut away in the dicing step, the short circuit between the signal electrodes of the actuators is eliminated, so that, in the final product, the actuators on the MEMS device can be controlled individually.

An analogous method may be used for testing a plurality of MEMS devices formed on a common wafer before the wafer is diced.

Consequently, the present invention also encompasses a method of manufacturing a plurality of MEMS devices from a common wafer and a method of testing a plurality of MEMS devices on a common wafer.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1:
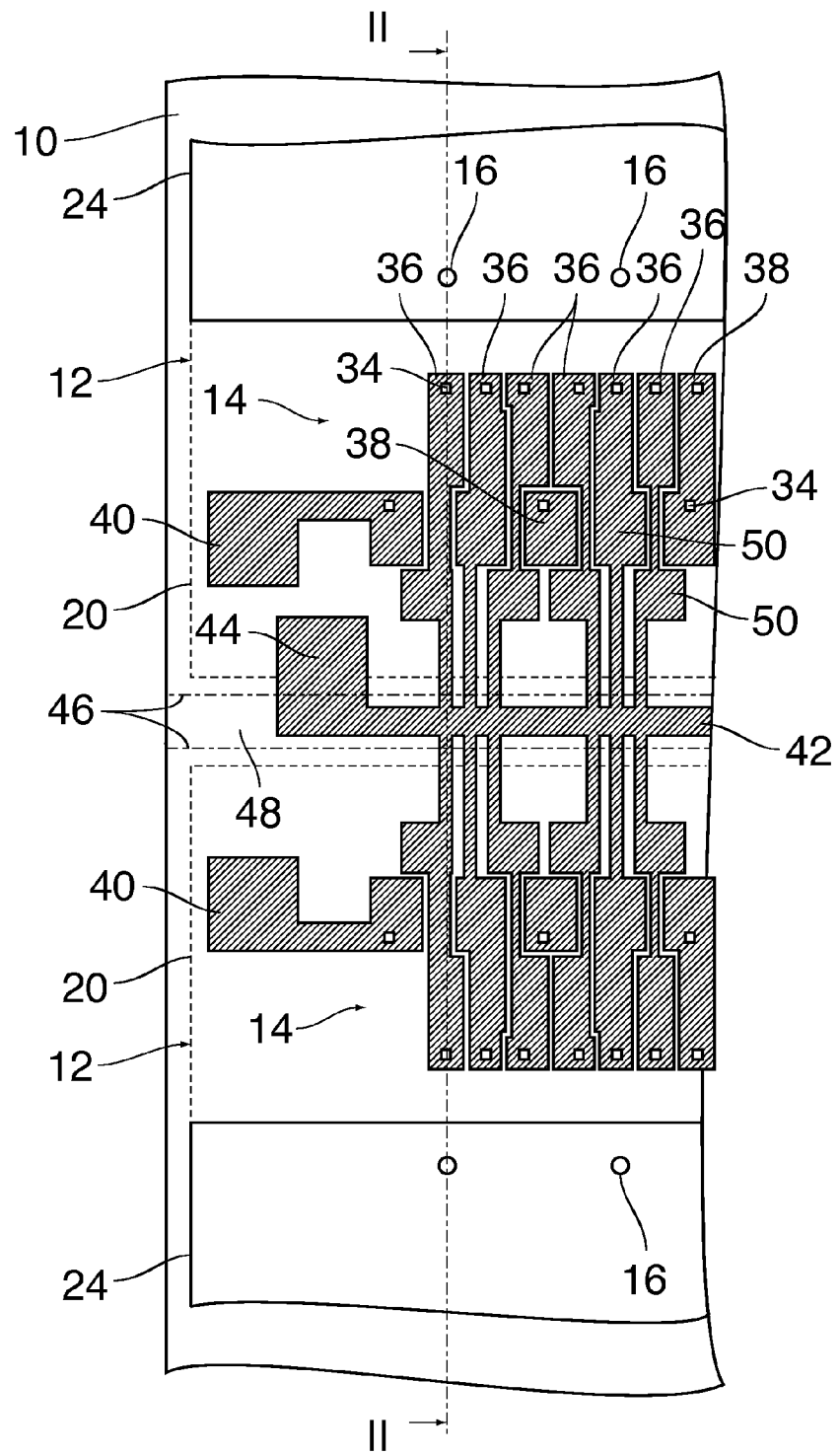
FIG. 1 is a plan view of an end portion of a substrate plate according to an embodiment of the present invention.

The present invention will now be described with reference to the accompanying drawings, wherein the same or similar elements are identified with the same reference numeral.

In FIG. 1, a portion of a substrate plate 10 has been shown on which two MEMS devices 12 have been formed. A pattern 14 of electrically conductive leads is formed on one surface of the substrate plate 10 for contacting the electric components of the MEMS devices 12. The MEMS devices 12 and the patterns 14 are arranged mirror-symmetrically in this example.

By way of example, each of the MEMS devices 12 constitutes a piezoelectric ink jet print head, which comprises a plurality of nozzles 16.

Figure 2:
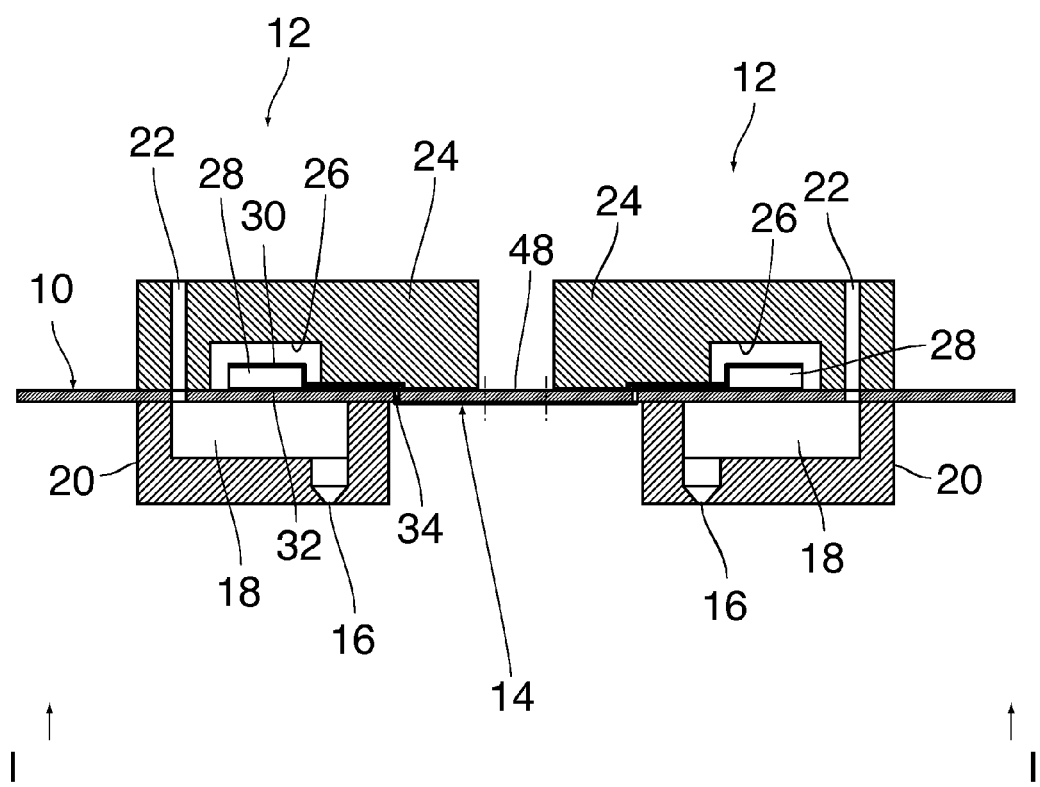
FIG. 2 is a sectional view taking along the line II-II in FIG. 1.

As can be seen more clearly in FIG. 2, each of the nozzles 16 is connected to an ink chamber 18 that is formed in a chamber block 20 of the MEMS device 12 and is connected to an ink duct 22 via an opening formed in the substrate plate 10. The ink duct 22 is formed in a duct block 24 that also forms an actuator chamber 26 accommodating a piezoelectric actuator 28. The actuator 28 is bonded to the top surface of the substrate plate 10. The substrate plate 10 forms a flexible membrane separating the ink chamber 18 from the actuator chamber 26.

When energized, the actuator 28 deforms in a bending mode, thereby deflecting the flexible membrane so that the volume of the ink chamber 18 is changed and an acoustic pressure wave is generated. The acoustic pressure wave propagates through the ink in the ink chamber 18 towards the nozzle 16, so that an ink droplet is ejected from the nozzle 18.

The actuator 28 is made of a thin film piezoelectric material, a ground electrode 30 and a signal electrode 32.

In an embodiment, the actuator 28 is a multi-layer actuator comprising a number of parallel electrodes embedded in the piezoelectric material. The electrodes in this embodiment form an alternating sequence of ground electrodes and signal electrodes 32. In FIG. 2, only one ground electrode 30 on the top side of the actuator and one signal electrode 32 on the bottom side of the actuator have been shown.

By means of a via 34 formed through the substrate plate 10, the signal electrode 32 is electrically connected to the conductive pattern 14, which is formed on the bottom side of the substrate plate 10 in FIG. 2. Similarly, by means of vias that are not visible in FIG. 2, the ground electrodes 30 of each actuator are connected to other parts of the pattern 14.

Figure 3:
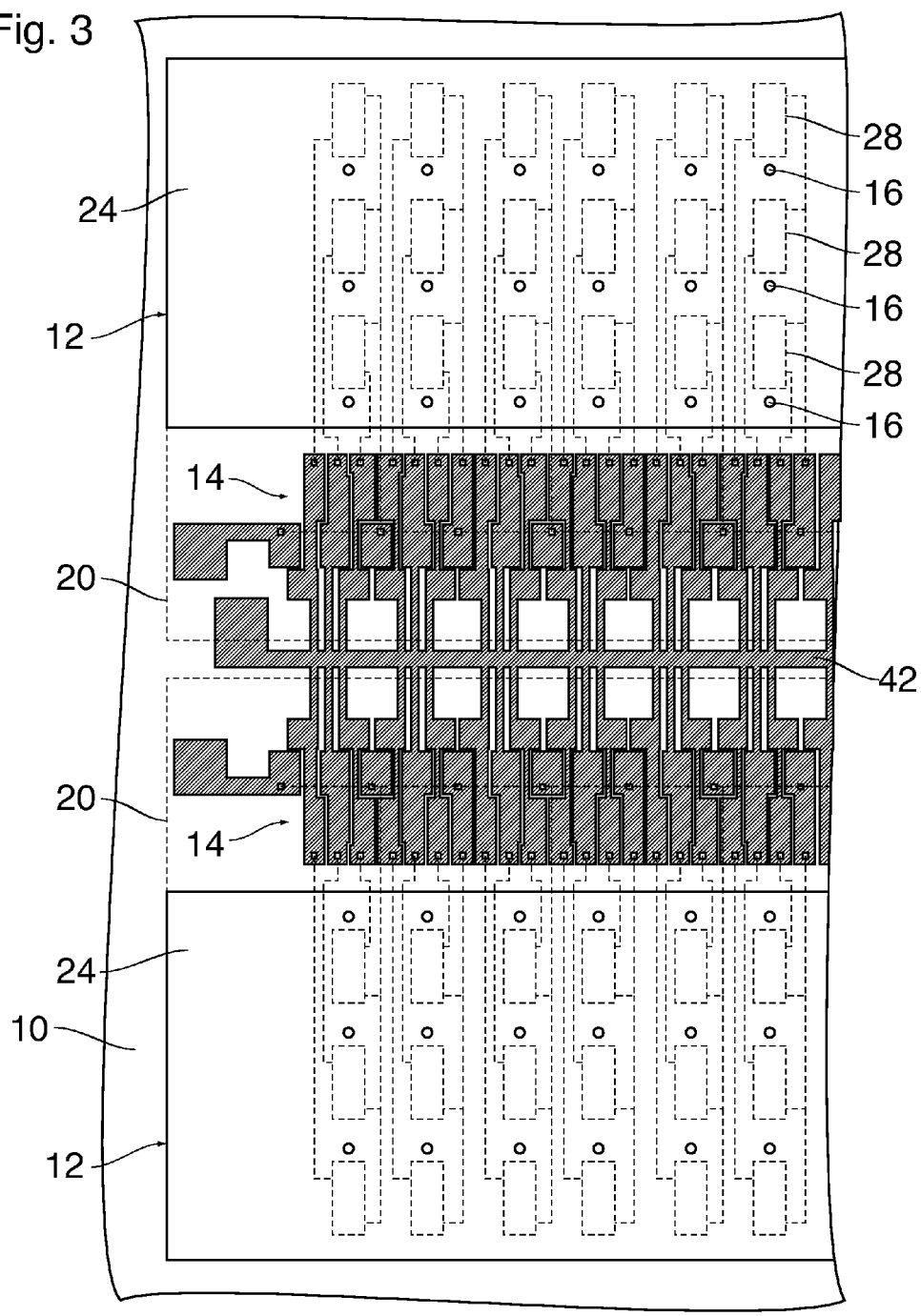
FIG. 3 is a plan view of a larger portion, on a reduced scale, of the substrate plate shown in FIG. 1.

As is shown in FIG. 3, the nozzles 16 of each MEMS device 12 are arranged in three rows and, correspondingly, the actuators 28 are also arranged in respective rows. Connections between the electrodes 30 and 32 of each actuator and the pattern 14 are shown as dashed lines in FIG. 3, because they are formed on the top side of the substrate plate 10 that is not visible in FIG. 3.

The pattern 14 is shown in greater detail in FIG. 1 and comprises, for each of the actuators 28, a signal contact pad 36 that serves as a wire bonding pad and is connected to the signal electrode 32 by means of one of the vias 34.

A common ground contact pad 38 is connected, through another via 34, to the ground electrodes 30 of the triplet of actuators 28 that occupy corresponding positions in the three nozzle rows. The ground contact pads 38 for the ground electrodes 30 of all actuators 28 on the MEMS device 12 are interconnected with each other (as is symbolized by a dashed line in FIG. 3) and are further connected to a device ground contact pad 40 disposed on one end (the left end in FIG. 1) of the nozzle row for grounding all actuators of the entire MEMS device.

The signal and ground contact pads 36, 38 for the first two actuator triplets shown in FIG. 1 have slightly different shapes. However, as is shown in FIG. 3, the pattern is repeated periodically for the subsequent triplets.

In the final product, the signal electrodes 32 of all the actuators 28 must be isolated from one another. In the condition shown in FIG. 1, however, where the two MEMS devices 12 are not yet separated from one another, but are formed on the common substrate plate 10, the signal contact pads 36 are all connected to a common lead structure 42 (a shunt bar) that extends along the border line of the two MEMS devices 12. At the left end of the row, shown in FIG. 1, the lead structure 42 is connected to an extra contact pad 44, which permits a common voltage to be applied to all of the signal electrodes 32 of all actuators 28 of both MEMS devices.

In FIG. 1, two parallel dot-dashed lines 46 that extend on both sides of the axis of symmetry of the patterns 14 delimit a portion of the substrate plate 10 that will be removed with a saw blade when a dicing cut 48 is formed for dividing the substrate plate 10 into a plurality of chip-sized units, also termed chips. Each of the plurality of chip-sized units includes a single MEMS device 12. As can be seen in FIG. 1, the lead structure 42 extends entirely inside the area of the dicing cut 48. In a practical example, the width of the saw blade, and hence the width of the dicing cut 48, may be 70 μm, whereas the shunt lead structure 42 only has a width of 40 μm. Thus, in the dicing step, the shunt bar is removed completely, and the tolerance (70 μm as compared to 40 μm) is large enough to assure that all the signal contact pads 36 will be isolated from one another and from the extra contact pad 44.

As is further shown in FIG. 1, each of the signal contact pads 36 is connected to (and in some cases directly adjoins) a test pad 50 that may be used for applying test signals to the actuators 28 and/or for deriving test signals from the actuators 28.

In FIG. 1, the contour of the chamber blocks 20 of the two MEMS devices is shown in dashed lines. These contours delimit the footprint of the MEMS devices 12 on the substrate plate 10. It should be noted that, in this example, the test pads 50 are disposed within the footprint of the respective MEMS devices 12, just as the signal contact pads 36 and the ground contact pads 38. The extra contact pad 44 is also disposed (mainly) within the footprint of one of the MEMS devices 12, so that only the lead structure 42 forming the shunt bar is disposed outside of the footprint of any MEMS device 12. Thus, when a test procedure on device level is performed after the dicing step, the test pads 50 may be used for applying and/or deriving test signals individually to and from each actuator 28 without having to use the contact pads 36 and 38 that may thus be reserved for wire bonding.

Figure 4:
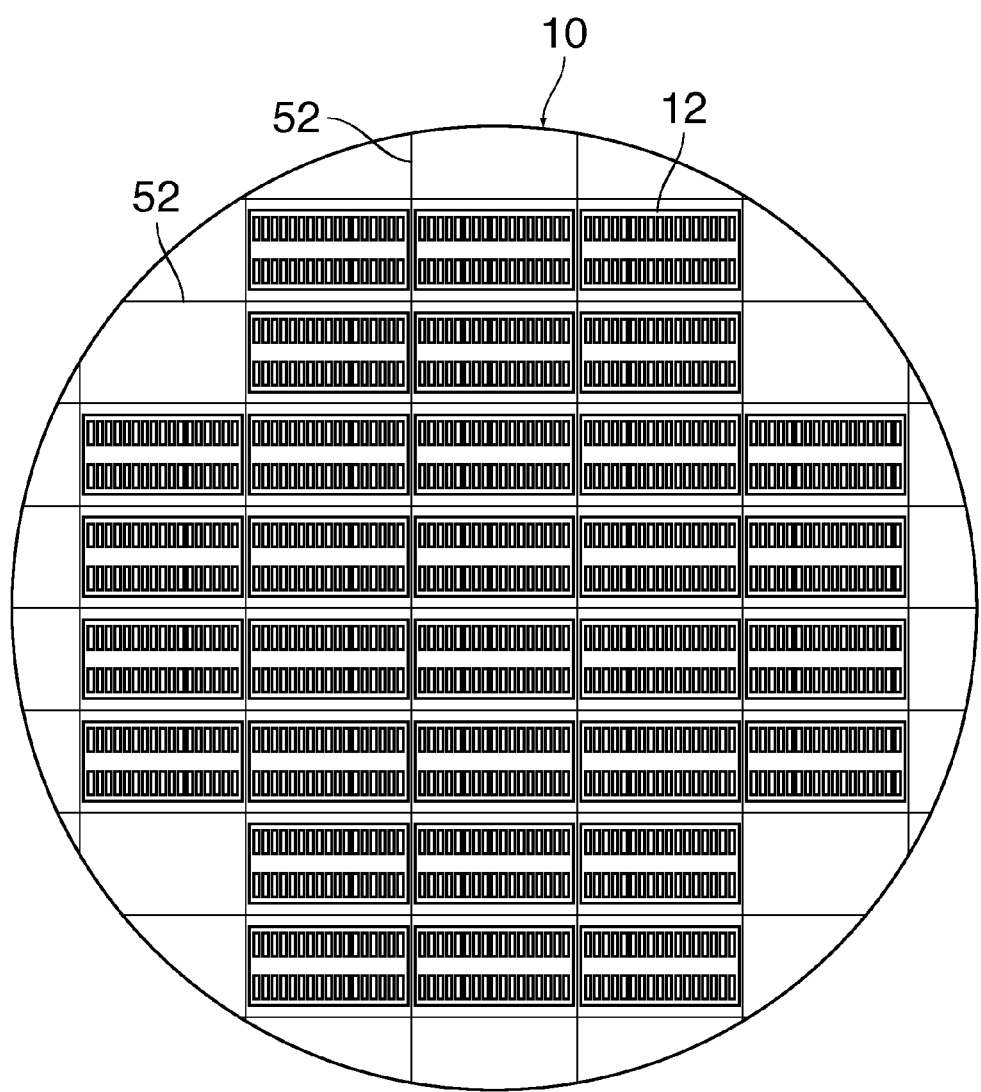
FIG. 4 is a plan view of a substrate plate wafer for a plurality of MEMS devices.

FIG. 4 shows a plan view of a complete wafer-size substrate plate 10 on which a plurality of MEMS devices 12 are formed. Cut lines 52 along which the wafer will be diced in order to form the individual MEMS devices 12 have been shown schematically in FIG. 4. Although not shown in FIG. 4, it will be understood that the lead structures 42 may optionally be arranged to interconnect the lead patterns 14 for all the MEMS devices 12 on the wafer.

Figure 5:
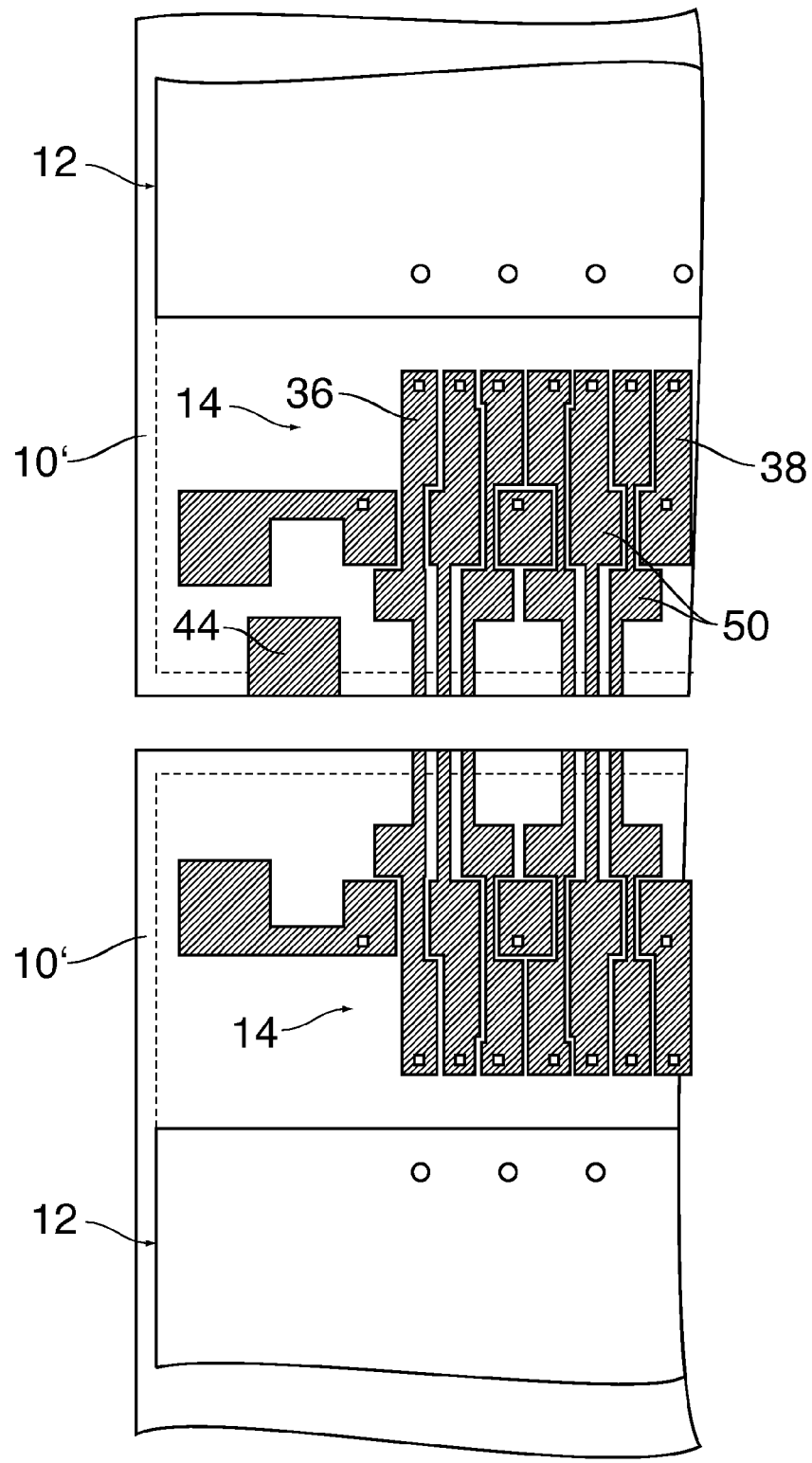
FIG. 5 is a plan view analogous to FIG. 1, showing two MEMS devices after dicing.

FIG. 5 shows the MEMS devices 12 separated from one another after the dicing step, i.e. after the substrate plate 10 has been divided into chip-sized units 10', also termed chips 10'. Comparing FIG. 5 to FIG. 1, it can be seen that the lead structure 42 has been removed completely and the extra contact pad 44 is isolated from the signal and ground contact pads 36, 38, which are now also isolated from one another, with the signal contact pads 36 being still connected to their respective test pads 50.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A substrate plate for at least one piezoelectric MEMS device to be mounted thereon, the at least one MEMS device having a certain footprint on the substrate plate and comprising a piezoelectric component, the substrate plate comprising:
   a pattern of electrically conductive leads for being connected to the piezoelectric component of the at least one MEMS device, said pattern of electrically conducting leads forming contact pads within the footprint of the at least one MEMS device, and said pattern of electrically conductive leads comprising at least one lead structure that extends on the substrate plate outside of the footprint of the at least one MEMS device, said at least one lead structure connecting a number of said contact pads to an extra contact pad,
   wherein said at least one lead structure is a shunt bar that interconnects the number of said contact pads to the extra contact pad of the at least one MEMS device and is arranged to be removed by means of a dicing cut separating the substrate plate into a plurality of chip-sized units, and
   wherein at least a part of said extra contact pad is formed within the footprint of the at least one MEMS device.

2. The substrate plate according to claim 1, wherein said substrate plate is for carrying at least two MEMS devices and corresponding patterns of electrically conducting leads, wherein said at least two MEMS devices have said at least one lead structure in common, wherein at least a part of said extra contact pad is formed within the footprint of one of the at least two MEMS devices.

3. The substrate plate according to claim 1, wherein said at least one lead structure interconnects the contact pads that correspond to at least three different MEMS devices to be mounted on the same substrate plate.

4. The substrate plate according to claim 1, comprising, in addition to said contact pads that are connected to said at least one lead structure, a plurality of ground contact pads that are interconnected with one another.

5. A method of manufacturing a plurality of MEMS devices formed on a common substrate plate, each MEMS device comprising a piezoelectric component, the method comprising the steps of:
   using the substrate plate according to claim 1 as the common substrate plate;
   applying a voltage to each the piezoelectric components of the at least one MEMS device by using said extra contact pad to apply said voltage to said at least one lead structure that is connected to the plurality of said piezoelectric components;
   applying a predetermined temperature to each piezoelectric component of the at least one MEMS device during the step of applying the voltage; and
   removing said at least one lead structure in a subsequent dicing step to separate the substrate plate into the plurality of chip-sized units.

6. The method according to claim 5, wherein said at least one lead structure interconnects the piezoelectric components in a plurality of the MEMS devices on the same substrate plate, and said voltage is applied to said plurality of piezoelectric components of said plurality of MEMS devices in a single step.

7. A method of testing a plurality of MEMS devices formed on a common substrate plate, said method comprising the steps of:
   using the substrate plate according to claim 1 as the common substrate plate;

using the extra contact pad for one of:
  applying a test signal to a piezoelectric component of the at least one MEMS device; and
  deriving a test signal from a piezoelectric component of the at least one MEMS device.

\* \* \* \* \*